(12) United States Patent
Kaempf et al.

(10) Patent No.: US 10,276,748 B2
(45) Date of Patent: Apr. 30, 2019

(54) RADIATION-EMITTING SEMICONDUCTOR CHIP, METHOD FOR PRODUCING A PLURALITY OF RADIATION-EMITTING SEMICONDUCTOR CHIPS AND OPTOELECTRONIC COMPONENT HAVING A RADIATION-EMITTING SEMICONDUCTOR CHIP

(71) Applicant: OSRAM Opto Semiconductors GmbH, Regensburg (DE)

(72) Inventors: Mathias Kaempf, Burglengenfeld (DE); Simon Jerebic, Tegernheim (DE); Ingo Neudecker, Neutraubling (DE); Guenter Spath, Regensburg (DE); Michael Huber, Bad Abbach (DE); Korbinian Perzlmaier, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 81 days.

(21) Appl. No.: 15/514,814

(22) PCT Filed: Oct. 7, 2015

(86) PCT No.: PCT/EP2015/073162
§ 371 (c)(1),
(2) Date: Mar. 27, 2017

(87) PCT Pub. No.: WO2016/055526
PCT Pub. Date: Apr. 14, 2016

(65) Prior Publication Data
US 2018/0233627 A1 Aug. 16, 2018

(30) Foreign Application Priority Data
Oct. 8, 2014 (DE) .......................... 10 2014 114 613

(51) Int. Cl.
*H01L 33/00* (2010.01)
*H01L 33/22* (2010.01)
*H01L 33/20* (2010.01)

(52) U.S. Cl.
CPC .......... *H01L 33/22* (2013.01); *H01L 33/0095* (2013.01); *H01L 33/20* (2013.01)

(58) Field of Classification Search
None
See application file for complete search history.

(56) References Cited

U.S. PATENT DOCUMENTS 5,233,204 A 8/1993 Fletcher et al.
6,648,454 B1 * 11/2003 Donaldson ........... B41J 2/14145
347/65

(Continued)

FOREIGN PATENT DOCUMENTS

DE 4427840 A1 2/1996
DE 10006738 A1 9/2001
(Continued)

*Primary Examiner* — Reema Patel
(74) *Attorney, Agent, or Firm* — McDermott Will & Emery LLP

(57) ABSTRACT

Disclosed is a radiation-emitting semi-conductor chip (1) comprising an epitaxial semi-conductor layer sequence (3) which emits electromagnetic radiation in operation. The epitaxial semi-conductor layer sequence (3) is applied on a a transparent substrate (4), wherein the substrate (4) has a first main surface (8) facing the semi-conductor layer sequence (3), a second main surface (9) facing away from the semi-conductor layer sequence (3) and a first lateral flank (10) arranged between the first main surface (8) and the second main surface (9), and the lateral flank (10) has a decoupling structure which is formed in a targeted manner from separating tracks. Also disclosed is a method for producing the semi-conductor chip, and a component comprising such a semi-conductor chip.

10 Claims, 7 Drawing Sheets

(56) References Cited

U.S. PATENT DOCUMENTS

| | | |
|---|---|---|
| 7,482,251 B1 | 1/2009 | Paulsen et al. |
| 8,729,585 B2 | 5/2014 | Yoshimura et al. |
| 2004/0026700 A1 | 2/2004 | Akaike et al. |
| 2005/0253157 A1 | 11/2005 | Ohashi et al. |
| 2011/0198665 A1 | 8/2011 | Furukawa |
| 2012/0322257 A1 | 12/2012 | Morgan |
| 2013/0015481 A1 | 1/2013 | Yoshimura et al. |

FOREIGN PATENT DOCUMENTS

| | | |
|---|---|---|
| DE | 102013111503 A1 | 4/2015 |
| EP | 0944918 A1 | 9/1999 |
| EP | 1357584 A2 | 10/2003 |
| WO | 9807187 A1 | 2/1998 |
| WO | 0161764 A1 | 8/2001 |
| WO | 2010150972 A2 | 12/2010 |
| WO | 2015055647 A1 | 4/2015 |

* cited by examiner

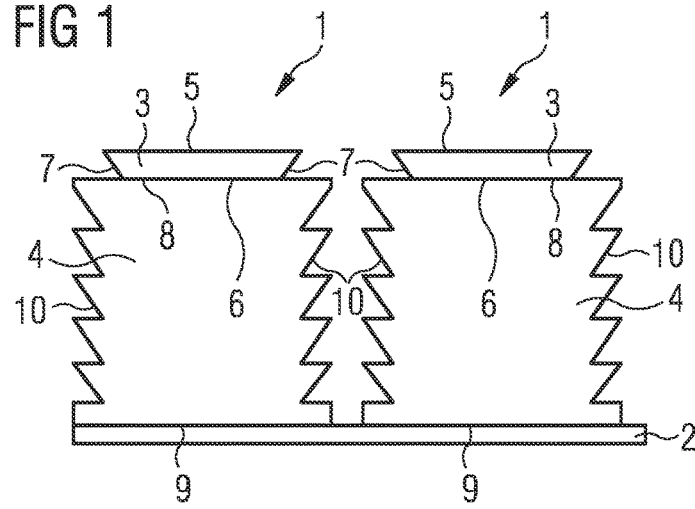
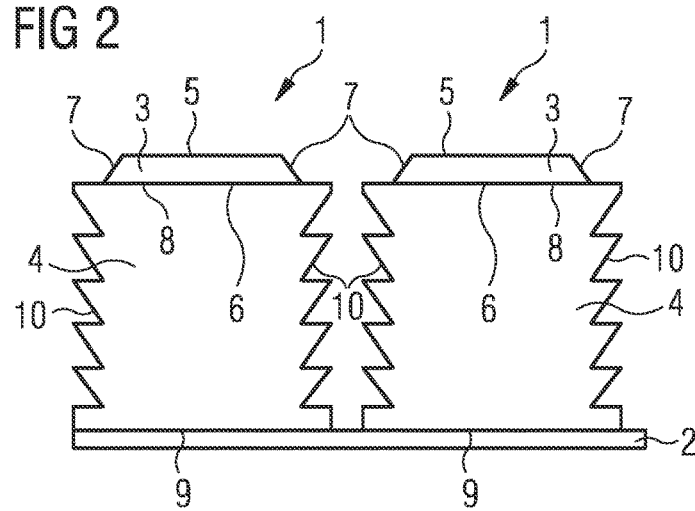
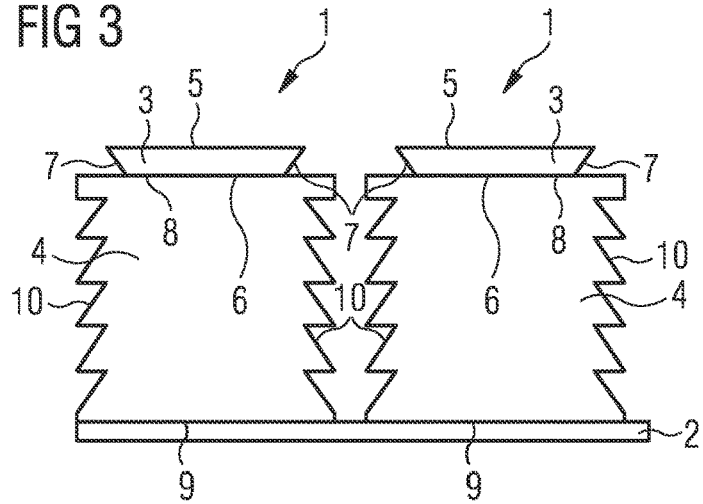

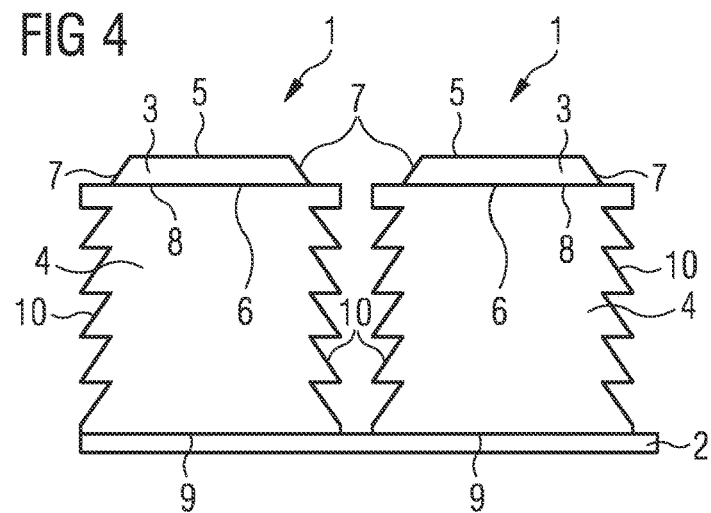
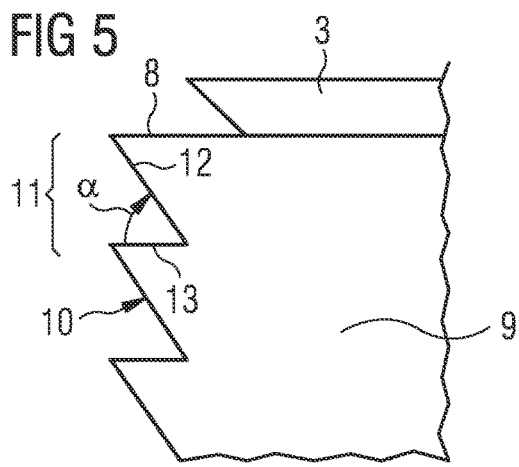
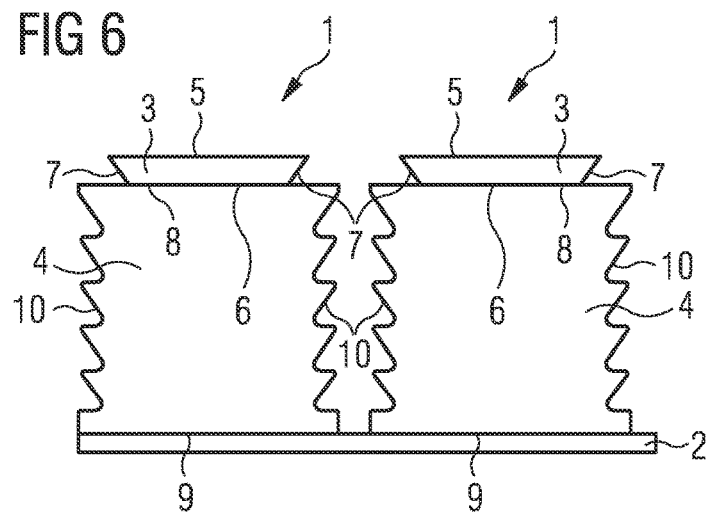

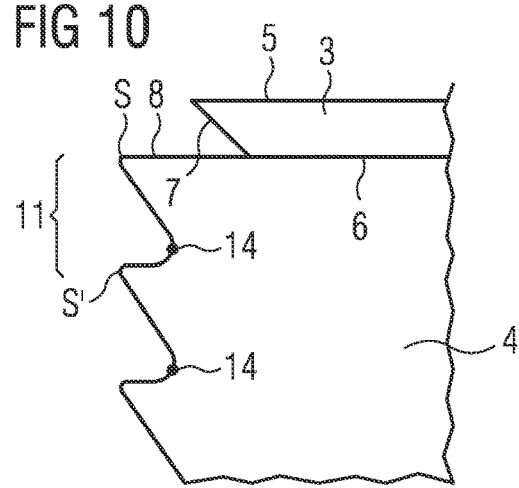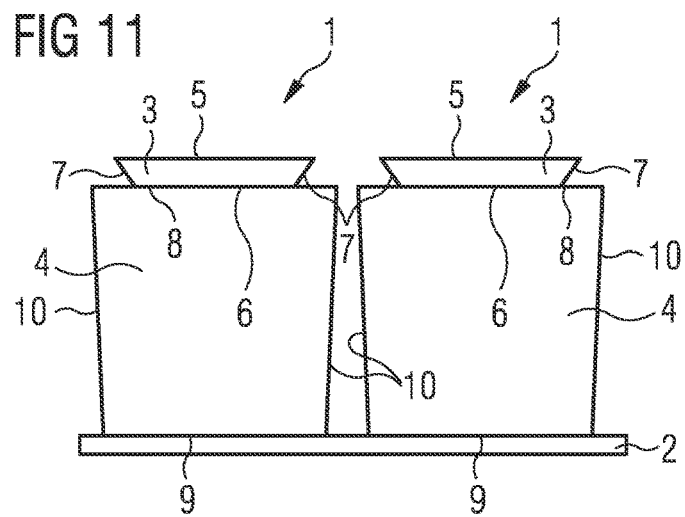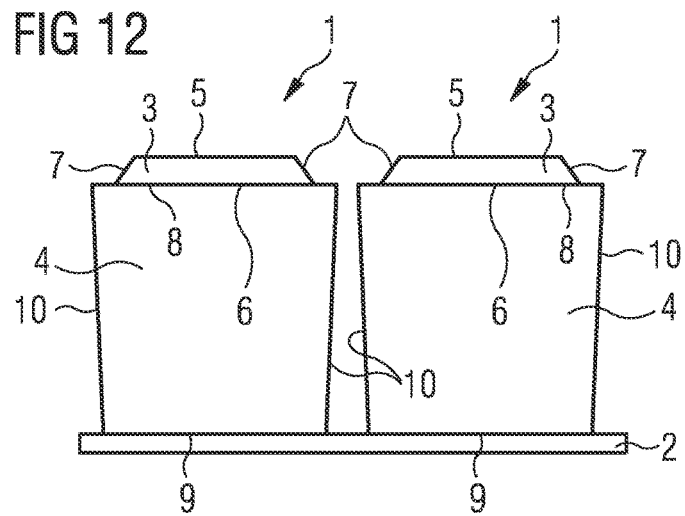

RADIATION-EMITTING SEMICONDUCTOR CHIP, METHOD FOR PRODUCING A PLURALITY OF RADIATION-EMITTING SEMICONDUCTOR CHIPS AND OPTOELECTRONIC COMPONENT HAVING A RADIATION-EMITTING SEMICONDUCTOR CHIP

A radiation-emitting semiconductor chip, a method for producing a plurality of radiation-emitting semiconductor chips and an optoelectronic component having such a radiation-emitting semiconductor chip are provided.

Radiation-emitting semiconductor chips and methods for the production thereof are described e.g. in patent documents WO 01/61764 A1, US 2011/0198665 A1, U.S. Pat. No. 5,233,204 A, DE 10 2013 111 503 A1 and US 2004/0026700 A1.

The object of the present application is to provide a radiation-emitting semiconductor chip with improved outcoupling of light as well as a simplified method for the production thereof. Furthermore, an optoelectronic component having such a semiconductor chip is to be provided.

A radiation-emitting semiconductor chip comprises an epitaxial semiconductor layer sequence, which emits electromagnetic radiation during operation. The electromagnetic radiation is generated in an active zone within the epitaxial semiconductor layer sequence and then emitted by a radiation exit surface of the epitaxial semiconductor layer sequence. Particularly preferably, the electromagnetic radiation is visible light, UV radiation or IR radiation.

The epitaxial semiconductor layer sequence is applied onto a carrier. Particularly preferably, the carrier is designed to be transparent for the electromagnetic radiation that is emitted by the epitaxial semiconductor layer sequence during operation. The term "transparent" here refers in particular to a carrier having a transmission coefficient of at least 0.85, preferably of at least 0.9 and particularly preferably of at least 0.95 for the respective wavelengths. The transmission coefficient here refers to the ratio of transmitted radiation to incident radiation.

The carrier can, for example, be a growth substrate on which the epitaxial semiconductor layer sequence is grown.

The carrier can comprise or consist of e.g. one of the following materials: sapphire, gallium arsenide, silicon, gallium nitride, silicon carbide.

Of these, sapphire and silicon carbide in particular transparent to visible electromagnetic radiation up to the ultraviolet spectral range, while gallium arsenide and silicon are transparent to infrared electromagnetic radiation. Gallium nitride is transparent to electromagnetic radiation with wavelengths in the visible spectral range up to the ultraviolet spectral range. Gallium nitride can be doped with InGaN here, which can lead to the material becoming absorbent in the ultraviolet spectral range.

Particularly preferably, the carrier comprises or consists of sapphire. The epitaxial semiconductor layer sequence here is preferably based on a nitride semiconductor material system of the formula $In_xAl_yGa_{1-x-y}N$ with $0 \leq x \leq 1$, $0 \leq y \leq 1$ and $x+y \leq 1$. In particular, sapphire is suitable as a growth substrate for a semiconductor layer sequence which is based on a nitride semiconductor material system. A semiconductor layer sequence that is based on a nitride semiconductor material system is generally suitable for generating blue to ultraviolet light.

Alternatively, it is also possible that the semiconductor layer sequence is based on an arsenide semiconductor material system of the formula $In_xAl_yGa_{1-x-y}As$ with $0 \leq x \leq 1$, $0 \leq y \leq 1$ and $x+y \leq 1$. Such epitaxial semiconductor layers are in particular suitable for generating infrared to red light.

Furthermore, the semiconductor layer sequence can also be based on a phosphide semiconductor material system of the formula $In_xAl_yGa_{1-x-y}P$ with $0 \leq x \leq 1$, $0 \leq y \leq 1$ and $x+y \leq 1$. Such epitaxial semiconductor layers are in particular suitable for generating red to green light.

Particularly preferably, the present semiconductor chip is a so-called volume emitter. A volume emitter is characterized in particular by the fact that electromagnetic radiation that is generated in the active region of the semiconductor layer sequence is partially also coupled out from the semiconductor chip via the lateral flank of the carrier. In contrast, a thin film chip, for example, is a surface emitter, which emits radiation generated in the active region substantially only from its radiation exit surface. A thin film chip comprises an epitaxial semiconductor layer sequence which is applied to a carrier other than a growth substrate. Between the carrier and the semiconductor layer sequence, furthermore, a mirror is arranged, which deflects radiation travelling from the semiconductor layer sequence towards the carrier in the direction of the radiation exit surface. In a thin film semiconductor chip, therefore, radiation is not coupled out of the lateral flank of the carrier but at best out of the lateral flank of the semiconductor layer sequence which is only a few micrometers thick.

The carrier comprises a first main surface facing the semiconductor layer sequence and a second main surface facing away from the semiconductor layer sequence. The two main surfaces preferably run parallel to one another. Between the first main surface and the second main surface, furthermore, a lateral flank of the carrier is arranged.

The lateral flank comprises an out-coupling structure, which is formed in a targeted manner from singulation traces. The out-coupling structure is suitable for increasing the out-coupling of light from the semiconductor chip, in particular relative to a semiconductor chip having a smooth, unstructured lateral flank.

The out-coupling structures can increase both the out-coupling of electromagnetic radiation via the lateral flank of the semiconductor chip and the out-coupling from the radiation exit surface of the semiconductor chip. The radiation exit surface of the semiconductor chip here is particularly preferably arranged parallel to the first main surface and/or second main surface of the carrier.

The out-coupling structures can, for example, increase out-coupling from the radiation exit surface of the semiconductor chip by deflecting radiation within the carrier, thus reducing total reflection of electromagnetic radiation within the carrier.

According to one embodiment of the semiconductor chip, the singulation traces that are formed in a targeted manner during the singulation process of the semiconductor chips form a saw-tooth-shaped out-coupling structure of the lateral flank.

The out-coupling structure comprises a plurality of structural elements or is formed from a plurality of structural elements. Preferably, the out-coupling structure is formed from a plurality of similar structural elements which directly adjoin one another. For example, the individual structural elements of which the out-coupling structure is composed are designed in a similar manner and arranged in a regular and/or periodic pattern. In particular, the out-coupling structure is particularly preferably not a roughening of the lateral flank, which is composed of an irregular sequence of different points and bulges. A roughening of this type can be produced e.g. by wet chemical etching.

For example, each structural element of the sawtooth-shaped out-coupling structure has a first surface and a second surface, wherein the first surface runs parallel to the first main surface and/or second main surface and the second surface encloses an acute opening angle with the first surface. The opening angle that is formed by the two surfaces points in the direction of the first main surface of the carrier, for example. In other words, the opening angle of a sawtooth-shaped out-coupling structure points e.g. to a radiation exit surface of the semiconductor chip. For example, the opening angle is between 40° and 70° inclusive, preferably between 45° and 60° inclusive.

Alternatively, it is also possible that each structural element of the sawtooth-shaped out-coupling structure has an opening angle that points in the direction of the second main surface of the carrier. In other words, the opening angle formed by the two surfaces of a sawtooth-shaped structural element can also point away from the radiation exit surface of the semiconductor chip.

Particularly preferably, the sawtooth structure has sharp corners and edges. However, the sawtooth structure can also have rounded edges, depending on how the process is managed. A sawtooth structure with sharp edges has the advantage that its structures deflect the impinging light in a more defined manner and thus the light is given direction in a more targeted manner.

If the sawtooth structure has rounded edges, each structural element of the sawtooth-shaped out-coupling structure can be of shell-shaped design. In this case, each structural element forms a trough in the lateral flank of the carrier. For example, each structural element can be designed as a shell-shaped depression within the lateral flank of the carrier. A shell-shaped depression is distinguished in particular by an asymmetrical shape, in which the lowest position is not at the same distance from the two directly neighboring points of the out-coupling structure.

A lateral width of the structural element is particularly preferably between 0.3 micrometers inclusive and 6 micrometers inclusive. The lower limit of the lateral width here is generally defined by the wavelengths of the electromagnetic radiation, while the theoretically conceivable upper limit depends only on the process management. Consequently, it is also conceivable that the structural element is sufficiently large that only one or two structural elements extend over the entire length of the flank. The entire length of a flank can be e.g. between 50 micrometers and 150 micrometers inclusive. The lateral width of a sawtooth structure results e.g. from the distance between two directly neighboring points of the sawtooth structure.

Preferably, a depth of a structural element of the out-coupling structure is between 0.1× and 2× the lateral width of the structural element, inclusive. Particularly preferably, the depth of a structural element of the out-coupling structure is between 0.5× and 1.5× the lateral width of the structural element, inclusive. For example, the depth of a structural element is less than 1× its lateral width. The depth of a structural element refers e.g. to the lowest position of the recess between two directly neighboring points of the sawtooth structure.

According to one embodiment of the semiconductor chip, the lateral flank of the carrier is inclined along its entire length in the vertical direction relative to a normal of the first main surface and/or second main surface of the carrier. Thus, the carrier can taper or widen continuously e.g. from its first main surface toward its second main surface along the entire length of the lateral flank. Particularly preferably, the lateral flank encloses an angle of between 15° and 45° inclusive with the normal of one of the two main surfaces of the carrier.

According to one embodiment of the semiconductor chip, the epitaxial semiconductor layer sequence likewise comprises a lateral flank, which is arranged between a first main surface and a second main surface of the epitaxial semiconductor layer sequence. For example, the first main surface and second main surface of the semiconductor layer sequence of the finished semiconductor chip are designed to be smaller than the first main surface of the carrier. In this way, the epitaxial semiconductor layer sequence is not damaged when the carrier is separated.

According to one embodiment of the semiconductor chip, the lateral flank of the semiconductor layer sequence also has an angle of inclination to a normal of the semiconductor layer sequence. For example, the lateral flank of the semiconductor layer sequence can have an undercut relative to the carrier. In this case, the lateral flank of the semiconductor layer sequence tapers from the radiation exit surface of the semiconductor chip towards the carrier. An undercut promotes the out-coupling of light in the direction of the radiation exit surface of the semiconductor chip.

Alternatively, it is also possible that the semiconductor layer sequence tapers in the opposite direction owing to an obliquely designed lateral flank, i.e. from the carrier toward the radiation exit surface of the semiconductor chip.

For the production of a plurality of radiation-emitting semiconductor chips, an epitaxial semiconductor layer sequence is first provided, which emits electromagnetic radiation during operation. The epitaxial semiconductor layer sequence here is applied onto a transparent carrier. For example, the epitaxial semiconductor layer sequence is grown epitaxially on the transparent carrier.

In a next step, the composite composed of the epitaxial semiconductor layer sequence and the carrier is singulated into a plurality of radiation-emitting semiconductor chips. Upon singulation, the lateral flank of the carrier is provided in a targeted manner with singulation traces, which are designed as out-coupling structures. This has the advantage that the structuring for increasing the out-coupling from the semiconductor chip is achieved at the same time as the singulating. This simplifies the production of the radiation-emitting semiconductor chip.

For example, a dry chemical etching method, such as for instance deep reactive ion etching (DRIE), can be used for singulating the composite composed of semiconductor layer sequence and carrier into semiconductor chips. The creation of the out-coupling structures on the lateral flank is particularly preferably achieved here by targeted variation of at least one parameter of the dry chemical etching method. For example, the flow of gas or the etching time can be varied during the dry chemical etching method in order to create the structuring of the lateral flank. Particularly preferably, the dry chemical separation method is a plasma separation method.

According to one embodiment of the method, a dry chemical etching method and a passivation of the areas of the lateral flank exposed by the dry chemical etching method are applied alternately in order to singulate the composite into semiconductor chips. In other words, a dry chemical etching method is first performed, in which a part of the lateral flank of the carrier is cut-through in the vertical direction. The vertical direction here refers to the direction opposite a normal of the first main surface of the carrier. The lateral flank and generally also the remainder of the exposed surfaces are then provided with a passivation layer. A dry chemical etching method is then performed again and, as a result, the carrier is further separated in the vertical direction. A passivation layer is then applied again. The application of the passivation layer and the dry chemical etching method are preferably repeated here until the carrier is completely separated.

The passivation layer comprises e.g. a fluorine compound or a chlorine compound or is formed from a fluorine compound or a chlorine compound. The thickness of the passivation layer is preferably between 150 nanometers and 1 micrometer inclusive.

During singulating, the composite composed of semiconductor layer sequence and carrier is particularly preferably applied onto an elastic film. This makes it easier to handle the finished semiconductor chips.

In particular, the present semiconductor chip is suitable for mounting in a component housing. The component housing particularly preferably comprises side walls which guide radiation coupled out via the lateral flank of the carrier to a radiation exit surface of the component housing. Furthermore, it is also possible for light to be guided by the out-coupling structures onto highly reflective surfaces within the component housing and a desired radiating characteristic of the component can be achieved in this way.

According to one embodiment of the component, the component comprises multiple semiconductor chips. The semiconductor chips are preferably arranged in a component housing.

Features or configurations that are described here only in relation to the semiconductor chip can, where meaningful, also be designed in conjunction with the method, and vice versa. Likewise, features or configurations that are described only in conjunction with the semiconductor chip or the method can be designed in conjunction with the optoelectronic component.

Further advantageous embodiments and developments of the invention result from the exemplary embodiments described below in conjunction with the figures.

BRIEF DESCRIPTION OF THE FIGURES:

FIGS. 1 to 15 show sectional illustrations of radiation-emitting semiconductor chips according to various exemplary embodiments that are explained in more detail.

Figure 7:
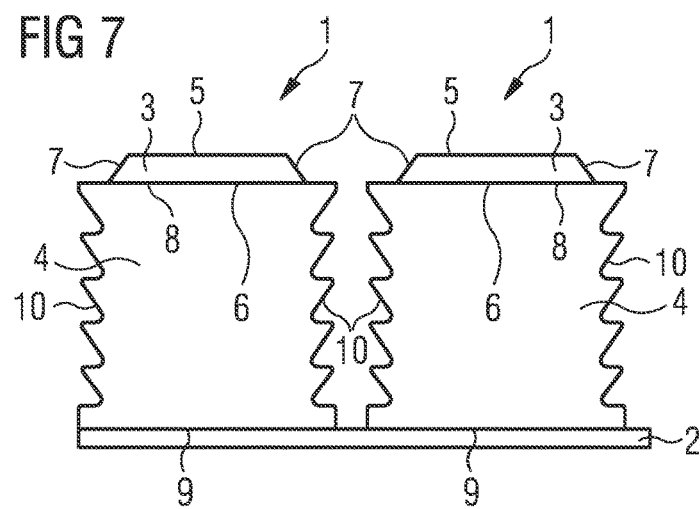

Identical, like or similar elements or elements having the same effect are provided with the same reference numerals in the figures. The figures and the size ratios to one another of the elements illustrated in the figures should not be considered as being to scale. Rather, to illustrate them better and/or to make them easier to understand, the size of individual elements, in particular layer thicknesses, may be illustrated in an exaggerated manner.

The semiconductor chips 1 according to the exemplary embodiment of FIG. 1 are arranged next to one another on an elastic film 2. The semiconductor chips 1 comprise an epitaxial semiconductor layer sequence 3 with an active region (not illustrated), which is suitable for generating electromagnetic radiation during operation.

The semiconductor layer sequence 3 is applied onto a carrier 4. The carrier 4 is designed to be transparent for the radiation that is generated in the active region of the semiconductor layer sequence 3.

The semiconductor layer sequence 3 comprises a first main surface 5, which faces away from the carrier 4, and a second main surface 6, which faces toward the carrier 4. The first main surface 5 is located opposite to the second main surface 6 and runs parallel thereto. The first main surface 5 is larger than the second main surface 6 in the present case. In other words, the semiconductor layer sequence 3 tapers from the first main surface 5 towards the second main surface 6, i.e. toward the carrier 4. Between the first main surface 5 and the second main surface 6, a lateral flank 7 of the semiconductor layer sequence 3 is arranged. The lateral flank 7 of the semiconductor layer sequence 3 is designed to be inclined to a normal of the main surfaces 5, 6 of the semiconductor layer sequence 3.

The carrier 4 also comprises a first main surface 8, which faces toward the semiconductor layer sequence 3, and a second main surface 9, which faces away from the semiconductor layer sequence 3. Between the first main surface 8 and the second main surface 9 a lateral flank 10 of the carrier 4 is formed. The first main surface 8 of the carrier 4 here has a larger area than the first main surface 5 and the second main surface 6 of the semiconductor layer sequence 3. Because of the inclination of the lateral flank 7 of the semiconductor layer sequence 3 relative to the normal of the semiconductor layer sequence 3, the semiconductor layer sequence 3 has an undercut relative to the carrier 4.

The lateral flank 10 of the carrier is furthermore provided with a sawtooth-shaped out-coupling structure along its entire length. The sawtooth-shaped out-coupling structure here is formed from singulation traces, as created e.g. in a method as described below with the aid of FIGS. 16 to 20.

The out-coupling structure of the semiconductor chip 1 according to FIG. 1 is designed as a sawtooth and comprises individual structural elements 11. FIG. 5 shows a detailed illustration of the lateral flank 10 from FIG. 1. Each structural element 11 of the saw-tooth-shaped out-coupling structure accordingly comprises a first surface 12 and a second surface 13. The first surface 12 runs parallel to the first main surface 8 and/or second main surface 9 of the carrier 4 and forms an acute opening angle α with the second surface 13. The opening angle α here points in the direction of the first main surface 8 of the carrier 4. In the present exemplary embodiment, the sawtooth structures are designed with sharp edges.

Furthermore, the out-coupling structure in the present exemplary embodiment is formed from similarly shaped structural elements 11, which are arranged in a regular pattern.

The semiconductor chips 1 according to the exemplary embodiment of FIG. 2, in contrast to the semiconductor chips 1 according to FIG. 1, comprise a semiconductor layer sequence 3, the lateral flanks 7 of which are inclined such that the semiconductor layer sequence 3 tapers continuously from a first main surface 5 of the semiconductor layer sequence 3 towards the carrier 4.

The semiconductor chips 1 according to the exemplary embodiment of FIG. 3, like the semiconductor chips 1 according to the exemplary embodiment of FIG. 1, comprise a lateral flank 7, which are provided with a saw-tooth-shaped out-coupling structure. However, the opening angle α, which is enclosed by the first surface 12 and the second surface 13, points away from the first main surface 8 of the carrier 4 in contrast to the opening angle α of the semiconductor chips 1 of FIG. 1.

The semiconductor chips 1 according to the exemplary embodiment of FIG. 4 also comprise structural elements 11 of a saw-tooth-shaped out-coupling structure, of which the opening angle α points away from the first main surface 8 of the carrier 4. Otherwise, the semiconductor chips 1 are designed as already described with the aid of FIG. 2.

Figure 8:
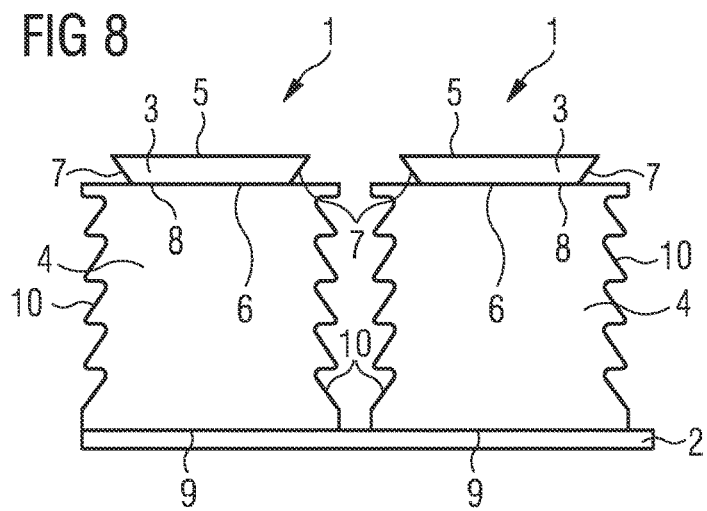
Figure 9:
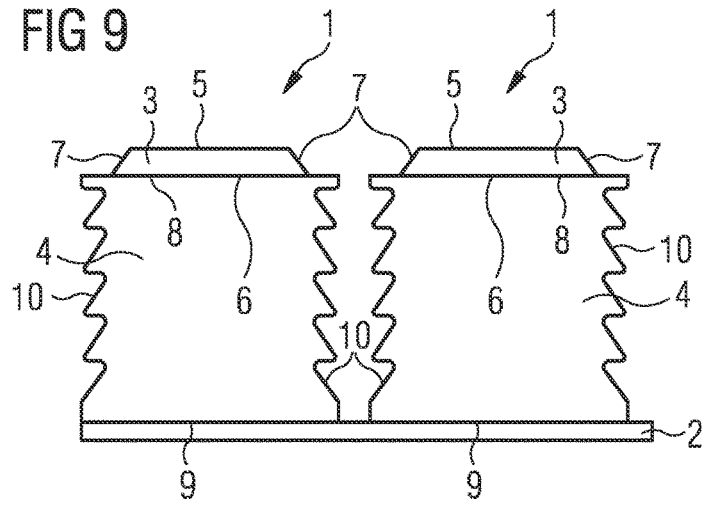

The semiconductor chips 1 according to the exemplary embodiments of FIGS. 6 to 10, in contrast to the embodiments already described, comprise lateral flanks 10 of the carrier 4 with sawtooth-shaped out-coupling structures with rounded edges. Each structural element 11 of the out-coupling structure here is designed as a shell-shaped depression in the lateral flank 10 of the carrier 4, as illustrated schematically in detail in the cut-out according to FIG. 10. The shell-shaped depression here is of asymmetrical design, i.e. its lowest position 14 is at different distances from the two directly neighboring points S, S'. Otherwise, the semiconductor chip according to FIG. 6 is designed in the same way as the semiconductor chip according to FIG. 1, the semiconductor chip according to FIG. 7 is designed in the same way as the semiconductor chip according to FIG. 2, the semiconductor chip according to FIG. 8 is designed in the same way as the semiconductor chip according to FIG. 3 and the semiconductor chip according to FIG. 9 is designed in the same way as the semiconductor chip according to FIG. 4.

Figure 15:
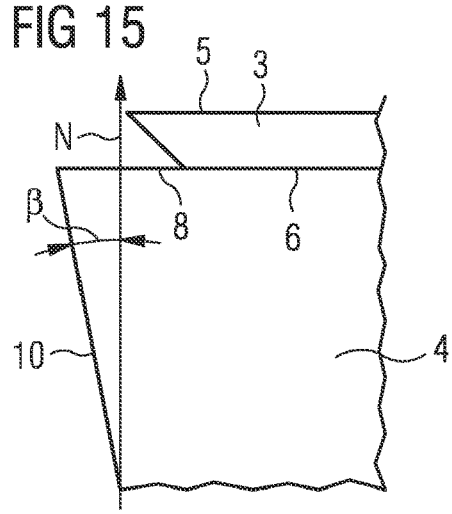
Figure 16:
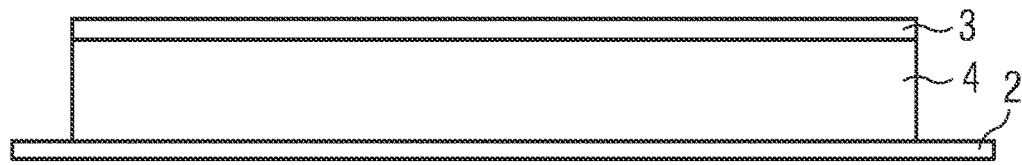
FIGS. 16 to 20 show sectional illustrations related to a method for producing a plurality of optoelectronic semiconductor chips according to an exemplary embodiment.

The radiation-emitting semiconductor chips 1 according to the exemplary embodiments of FIGS. 11, 12 and 15 differ from the radiation-emitting semiconductor chips 1 according to FIGS. 1 and 2 only in the inclination of the lateral flank 10 of the carrier 4. FIG. 15 shows a cut-out of the lateral flank 10 of the semiconductor chip 1 according to FIG. 11. In these exemplary embodiments, the lateral flank 10 of the carrier 4 in each case is inclined along its entire length relative to a normal N of one of the main surfaces 8, 9 of the carrier 4 in such a way that the cross-sectional area of the carrier 4 tapers from its first main surface 8 toward its second main surface 9. The lateral flank 10 of the semiconductor chip 1 preferably forms an angle β with a normal N of one of the main surfaces 8, 9 of the carrier 4 which is between 15° and 45° inclusive (see FIG. 15).

The lateral flank[s] of the semiconductor chips 1 according to FIGS. 11, 12 and 15 also have singulation traces which form out-coupling structures. For reasons of clarity, however, these are not illustrated in the figures.

Figure 13:
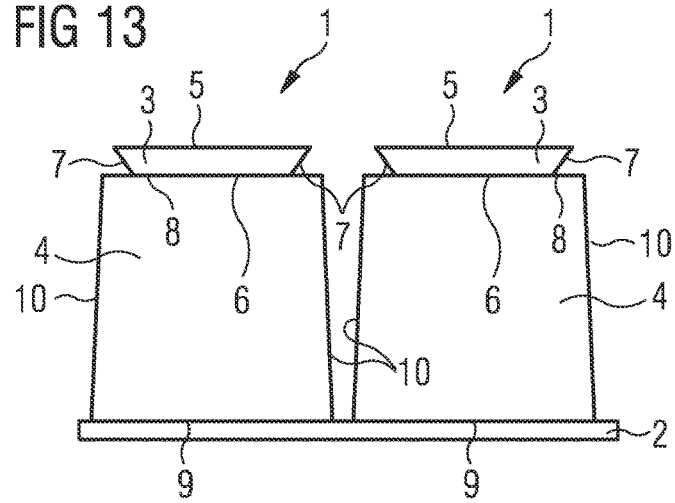
Figure 14:
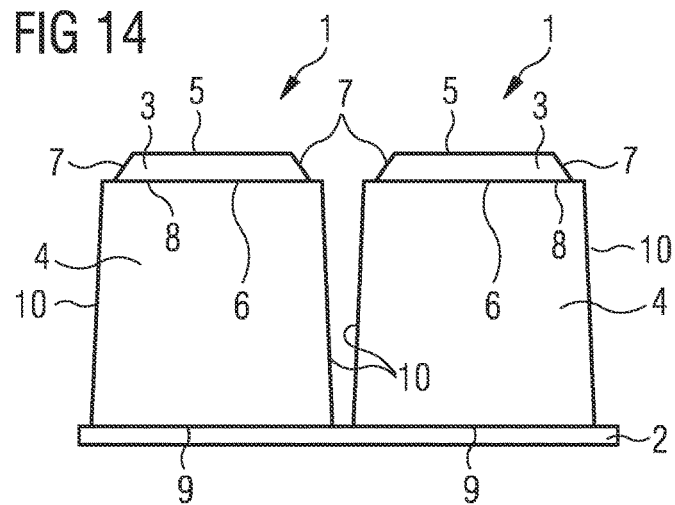

The optoelectronic semiconductor chips 1 according to the exemplary embodiments of FIGS. 13 and 14, in contrast to the exemplary embodiments of FIGS. 11 and 12, comprise lateral flanks 10 which are inclined relative to a normal N of the main surfaces 8, 9 of the carrier 4 such that the carrier 4 widens continuously from its first main surface 8 toward its second main surface 9.

In the method according to the exemplary embodiment of FIGS. 16 to 20, in a first step an epitaxial semiconductor layer sequence 3 is provided, which is suitable for emitting electromagnetic radiation. The epitaxial semiconductor layer sequence 3 is applied onto a carrier 4 and forms a composite therewith. The carrier 4 is designed to be transmissive to the radiation of the semiconductor layer sequence 3.

Particularly preferably, the semiconductor layer sequence 3 is based on a gallium nitride material while the carrier 4 comprises or consists of sapphire.

The composite composed of carrier 4 and semiconductor layer sequence 3 is applied onto a flexible film 2 in the present case.

Figure 17:
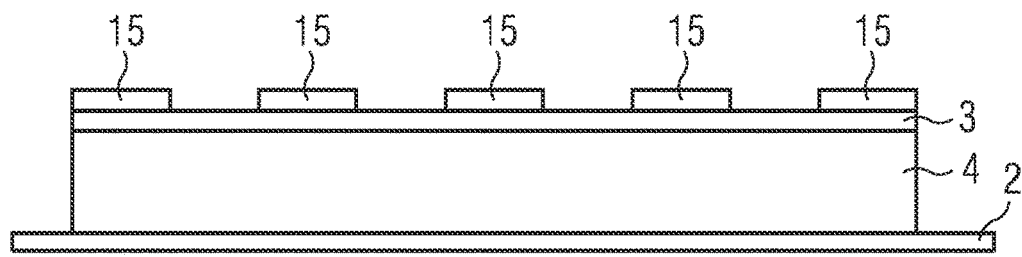

In a next step, as illustrated schematically in FIG. 17, a patterned photoresist layer 15 is applied to the semiconductor layer sequence 3, leaving areas of the semiconductor layer sequence 3 exposed. The exposed areas of the semiconductor layer sequence 3 are intended to form separating trenches between the later semiconductor chips 1.

Figure 18:
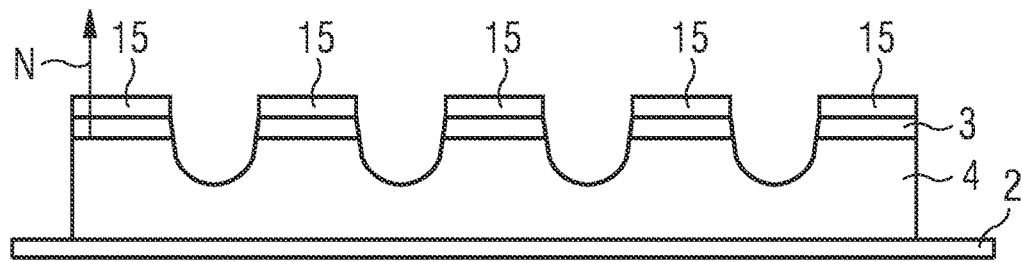

As shown schematically in FIG. 18, the carrier 4 is first etched to a specific depth in the vertical direction, i.e. opposite to a direction of a normal N of one of the main surfaces 5, 6 of the semiconductor layer sequence 3, by means of a dry chemical etching process, particularly preferably by means of a plasma separation process.

Figure 19:
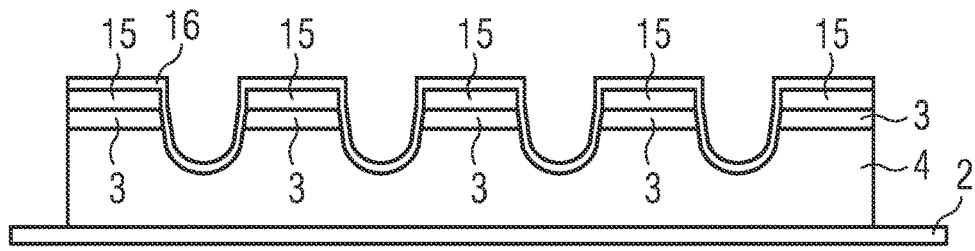

Next, as illustrated schematically in FIG. 19, a passivation layer 16 is deposited on the entire layer composite. The passivation layer can comprise or consist of e.g. a fluorine compound or a chlorine compound.

Figure 20:
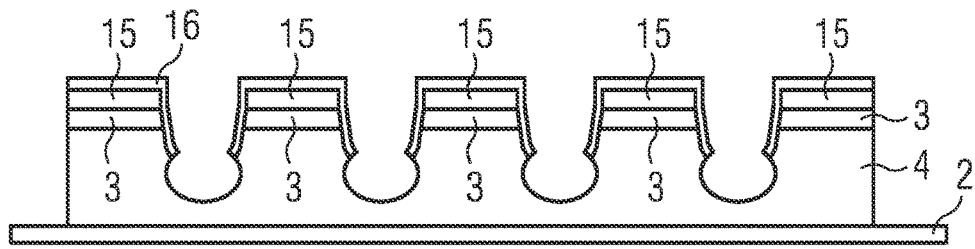

In a next step, a dry chemical etching process is performed again, which separates the carrier 4 further in the vertical direction (FIG. 20). The lateral flank 10 of the carrier 4 here is protected by the passivation layer 16. As can be seen in FIG. 20, singulation traces are created during this type of separation, which in the present case are configured as out-coupling structures by a targeted process management.

In the present method, the steps as described with the aid of FIGS. 18, 19 and 20, i.e. the application of the passivation layer 16 and the piecewise separation of the carrier 4 by means of a dry chemical etching process, are now repeated alternately until the carrier 4 is particularly preferably separated along its entire vertical length.

Figure 21:
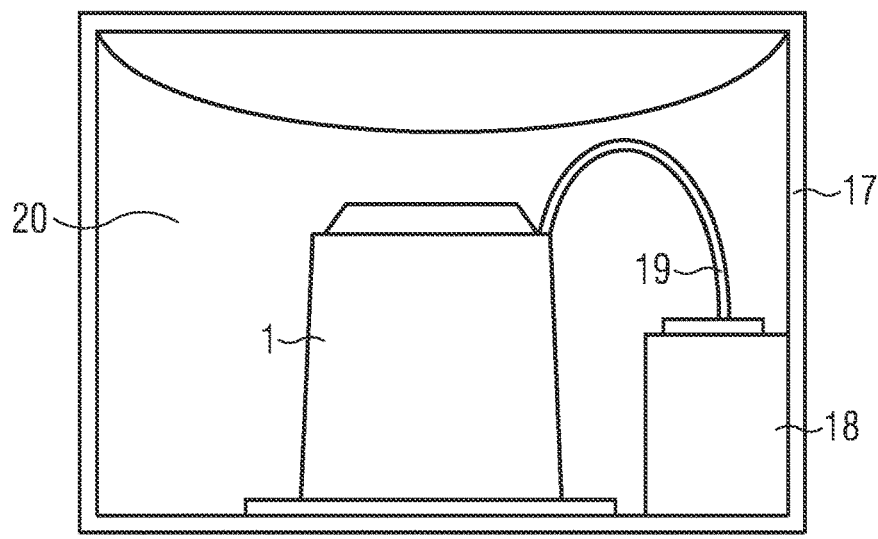
FIG. 21 shows a schematic sectional illustration of an optoelectronic component according to an exemplary embodiment.

The optoelectronic component according to the exemplary embodiment of FIG. 21 comprises a radiation-emitting semiconductor chip 1, as has already been described e.g. by means of FIGS. 1 to 15. The semiconductor chip 1 is mounted on the base of a component housing 17, e.g. by means of an adhesive layer or a solder layer (not illustrated). The component housing 17 furthermore comprises an electrical connection area 18, which is electrically bonded to the semiconductor chip 1 by means of a bonding wire 19. Furthermore, the component housing 1 is filled with a clear potting material 20, which completely surrounds the semiconductor chip.

The present application claims the priority of the German application DE 102014114613.1, the disclosure content of which is incorporated herein by reference.

The description by means of the exemplary embodiments does not limit the invention thereto. Rather, the invention comprises any new feature and any combination of features, which in particular includes any combination of features in the patent claims, even if this feature or this combination is not explicitly stated in the patent claims or exemplary embodiments.

The invention claimed is:
1. A radiation-emitting semiconductor chip having:
an epitaxial semiconductor layer sequence, which emits electromagnetic radiation during operation,
a transparent carrier, onto which the epitaxial semiconductor layer sequence is applied, wherein
the carrier comprises a first main surface facing the semiconductor layer sequence, a second main surface facing away from the semiconductor layer sequence and a lateral flank arranged between the first main surface and the second main surface, and the lateral flank comprises a sawtooth-shaped out-coupling structure, which is formed in a targeted manner from singulation traces,
   wherein each structural element of the sawtooth-shaped out-coupling structure comprises a first surface and a second surface,
   wherein the first surface runs parallel to the first main surface and/or to the second main surface of the carrier, and the second surface encloses an acute opening angle with the first surface,
   wherein the opening angle points in the direction of the first main surface of the carrier or in the direction of the second main surface of the carrier.

2. The radiation-emitting semiconductor chip according to claim 1, in which the lateral flank is inclined along its entire length in the vertical direction relative to a normal of the first main surface and/or the second main surface of the carrier.

3. The radiation-emitting semiconductor chip according to claim 1, in which the out-coupling structure comprises a plurality of similar structural elements, which are arranged in a regular and/or periodic pattern.

4. The radiation-emitting semiconductor chip according to claim 1, wherein the saw-tooth structure comprises rounded edges.

5. The radiation-emitting semiconductor chip according to claim 1, in which the carrier comprises one of the following materials: sapphire, gallium arsenide, silicon, gallium nitride, silicon carbide.

6. An optoelectronic component, in which one or more radiation-emitting semiconductor chip(s) according to claim 1 is/are arranged in a component housing.

7. A method for producing a plurality of radiation-emitting semiconductor chips comprising the following steps:
   providing an epitaxial semiconductor layer sequence, which emits electromagnetic radiation during operation, wherein the epitaxial semiconductor layer sequence is applied onto a transparent carrier,
   singulating of the composite composed of the epitaxial semiconductor layer sequence and the carrier into a plurality of radiation-emitting semiconductor chips,
      wherein a lateral flank of the carrier is provided in a targeted manner with singulation traces, which are designed as out-coupling structures, which are designed as sawtooth-shaped out-coupling structures,
      wherein each structural element of the sawtooth-shaped out-coupling structure comprises a first surface and a second surface,
      wherein the first surface runs parallel to the first main surface and/or to the second main surface of the carrier, and the second surface encloses an acute opening angle with the first surface,
      wherein the opening angle points in the direction of the first main surface of the carrier or in the direction of the second main surface of the carrier.

8. The method according to claim 7, in which a dry chemical etching method is used for singulating the composite into semiconductor chips.

9. The method according to claim 7, in which a dry chemical etching method and a passivation step of the areas of the lateral flank of the carrier formed by the dry chemical etching method are used alternately for singulating the composite into semiconductor chips.

10. The method according to claim 7, in which the saw-tooth structure has rounded edges.

* * * * *